US010068864B2

(12) United States Patent
Arvin et al.

(10) Patent No.: US 10,068,864 B2
(45) Date of Patent: *Sep. 4, 2018

(54) NANOWIRES FOR PILLAR INTERCONNECTS

(71) Applicant: International Business Machines Corporation, Armonk, NY (US)

(72) Inventors: Charles L. Arvin, Poughkeepsie, NY (US); Jeffrey P. Gambino, Portland, OR (US); Christopher D. Muzzy, Burlington, VT (US); Wolfgang Sauter, Burke, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/453,113

(22) Filed: Mar. 8, 2017

(65) Prior Publication Data
US 2017/0179061 A1 Jun. 22, 2017

Related U.S. Application Data

(60) Division of application No. 15/191,628, filed on Jun. 24, 2016, now Pat. No. 9,679,806, which is a
(Continued)

(51) Int. Cl.
*H01L 23/48* (2006.01)
*H01L 23/00* (2006.01)
(Continued)

(52) U.S. Cl.
CPC ............ *H01L 24/13* (2013.01); *H01L 21/563* (2013.01); *H01L 24/05* (2013.01); *H01L 24/11* (2013.01);
(Continued)

(58) Field of Classification Search
CPC ...... H01L 21/0272–21/0279; H01L 21/76877; H01L 21/76879; H01L 21/76882
See application file for complete search history.

(56) References Cited

U.S. PATENT DOCUMENTS 5,401,687 A 3/1995 Cole et al.
6,297,063 B1 10/2001 Brown et al.
(Continued)

FOREIGN PATENT DOCUMENTS

JP 2000340569 A 12/2000
JP 3727818 B2 12/2005
(Continued)

OTHER PUBLICATIONS

Wang et al. "Low Temperature Wafer bonding by copper nanorod array" in Electrochemical and Solid State Letters, vol. 12, pp. H138-H141. Published by the Electrochemical Society in 2009.*
(Continued)

*Primary Examiner* — Joseph C Nicely
*Assistant Examiner* — Tuan A Hoang
(74) *Attorney, Agent, or Firm* — Erik K. Johnson

(57) ABSTRACT

An embodiment of the invention may include a semiconductor structure, and method of forming the semiconductor structure. The semiconductor structure may include a first set of pillars located on a first substrate. The semiconductor structure may include a second set of pillars located on a second substrate. The semiconductor structure may include a joining layer connecting the first pillar to the second pillar. The semiconductor structure may include an underfill layer located between the first and second substrate.

11 Claims, 4 Drawing Sheets

Related U.S. Application Data continuation-in-part of application No. 14/957,684, filed on Dec. 3, 2015, now abandoned.

(51) Int. Cl.
*H01L 21/56* (2006.01)
*H01L 25/065* (2006.01)
*H01L 25/00* (2006.01)

(52) U.S. Cl.
CPC .......... *H01L 24/81* (2013.01); *H01L 25/0657* (2013.01); *H01L 25/50* (2013.01); *H01L 2224/0401* (2013.01); *H01L 2224/05147* (2013.01); *H01L 2224/05166* (2013.01); *H01L 2224/05171* (2013.01); *H01L 2224/05184* (2013.01); *H01L 2224/1147* (2013.01); *H01L 2224/11632* (2013.01); *H01L 2224/13019* (2013.01); *H01L 2224/13026* (2013.01); *H01L 2224/13082* (2013.01); *H01L 2224/13147* (2013.01); *H01L 2224/8112* (2013.01); *H01L 2224/81193* (2013.01); *H01L 2224/81203* (2013.01); *H01L 2225/06513* (2013.01)

(56) References Cited

U.S. PATENT DOCUMENTS

| | | | |
|---|---|---|---|
| 6,340,822 B1 | 1/2002 | Brown et al. | |
| 6,383,923 B1 | 5/2002 | Brown et al. | |
| 7,183,648 B2 | 2/2007 | Ramanathan et al. | |
| 7,371,674 B2* | 5/2008 | Suh | H01L 24/11 257/E21.287 |
| 7,479,702 B2 | 1/2009 | Uang et al. | |
| 7,569,935 B1* | 8/2009 | Fan | H01L 24/16 257/737 |
| 7,781,260 B2 | 8/2010 | Sane et al. | |
| 7,791,440 B2 | 9/2010 | Ramadan et al. | |
| 7,964,964 B2 | 6/2011 | Sheats | |
| 7,973,407 B2 | 7/2011 | Ramanathan et al. | |
| 8,004,076 B2* | 8/2011 | Zarbock | B81C 1/00269 257/690 |
| 8,203,208 B2 | 6/2012 | Ramanathan et al. | |
| 8,253,253 B2 | 8/2012 | Brud et al. | |
| 8,420,978 B2* | 4/2013 | Jain | H01L 21/0272 219/121.69 |
| 8,421,225 B2 | 4/2013 | Ramanathan et al. | |
| 8,592,995 B2* | 11/2013 | Lin | H01L 23/49816 257/737 |
| 8,643,179 B2 | 2/2014 | Im et al. | |
| 2005/0003650 A1 | 1/2005 | Ramanathan et al. | |
| 2005/0003652 A1 | 1/2005 | Ramanathan et al. | |
| 2005/0003664 A1 | 1/2005 | Ramanathan et al. | |
| 2005/0275497 A1 | 12/2005 | Ramadan et al. | |
| 2007/0148949 A1 | 6/2007 | Suh et al. | |
| 2008/0227294 A1* | 9/2008 | Suh | B82Y 10/00 438/687 |
| 2009/0065932 A1 | 3/2009 | Sane et al. | |
| 2009/0174070 A1 | 7/2009 | Ramanathan et al. | |
| 2010/0305516 A1 | 12/2010 | Xu et al. | |
| 2011/0260319 A1 | 10/2011 | Ramanathan et al. | |
| 2012/0119359 A1 | 5/2012 | Im et al. | |
| 2012/0280387 A1 | 11/2012 | Ramanathan et al. | |
| 2013/0270329 A1 | 10/2013 | Schulte | |
| 2014/0145328 A1 | 5/2014 | Tummala et al. | |
| 2014/0147974 A1 | 5/2014 | Im et al. | |
| 2014/0252614 A1 | 9/2014 | Chang et al. | |
| 2014/0353018 A1 | 12/2014 | Soeda et al. | |

FOREIGN PATENT DOCUMENTS

| | | |
|---|---|---|
| WO | 2005122194 A1 | 12/2005 |
| WO | 2013134054 A1 | 9/2013 |
| WO | 2015118611 A1 | 8/2015 |

OTHER PUBLICATIONS

Wang et al. "Low Temperature wafer bonding by copper nanorod array" in Electrochemical and Solid State letters vol. 12, pp. H138-H141. Published by the Electrochemical Society in 2009.*

Gerber et al., "Next Generation Fine Pitch Cu Pillar Technology—Enabling Next Generation Silicon Nodes", 2011 Electronic Components and Technology Conference, IEEE, pp. 612-618.

Krahne et al., "Physical Properties of Nanorods," Melting Studies of Elongated Inorganic Nanoparticles, 3 pgs., published by Springer-Verlag, 2013.

Lin et al., "Evaluation of Cu-bumps with lead-free solders for flip-chip package applications", Microelectronic Engineering, vol. 86, 2009, pp. 2392-2395.

Wang et al., "Low Temperature Wafer bonding by Copper Nanorod Array" in Electrochemical and Solid-State Letters, vol. 12, pp. H138-H141. Published by The Electrochemical Society in 2009.

Wang et al., "Copper/Parylene Core/Shell Nanowire Surface Fastener Used for Room-Temperature Electrical Bonding", Langmuir, Article, 2013 American Chemical Society, pp. 13909-13916.

Wang et al., "Room-Temperature Bonding Technique Based on Copper Nanowire Surface Fastener", Applied Physics Express vol. 6, 2013, The Japan Society of Applied Physics, pp. 035001-1-035001-4.

Zurcher, "Nanoparticle Assembly and Sintering Towards All-Copper Flip Chip Interconnects", 2015 Electronic Components & Technology Conference, pp. 1115-1121.

Arvin et al., "Nanowires for Pillar Interconnects," U.S. Appl. No. 14/957,684, filed Dec. 3, 2015, pp. 1-18.

Arvin et al., "Nanowires for Pillar Interconnects," U.S. Appl. No. 15/041,381, filed Feb. 11, 2016, pp. 1-17.

Arvin et al., "Nanowires for Pillar Interconnects," U.S. Appl. No. 15/191,628, filed Jun. 24, 2016, pp. 1-17.

IBM: List of Patents or Patent Applications Treated as Related (Appendix P), Mar. 8, 2018, 2 pgs.

* cited by examiner

NANOWIRES FOR PILLAR INTERCONNECTS

BACKGROUND

The present invention relates generally to semiconductor structures and methods of manufacture and, more particularly, to connect interconnect structures with copper nanowires.

New integrated circuit technologies include three-dimensional integrated circuits. One type of 3D integrated circuit may include two or more layers of active electronic components stacked vertically and electrically joined with through-substrate vias and solder bumps. The 3D integrated circuit may provide numerous benefits such as increased package density yielding a smaller footprint, and improved bandwidth due to the short connection lengths made possible by the use of through-silicon-vias. The 3D integrated circuit described above may be fabricated in any number of known methods. Some 3D integrated circuits may include a silicon interposer which may be used to re-direct circuitry between a ship carrier and one or more top chips.

Copper pillars are a chip-to-chip interconnect technology used to enhance electromigration performance, to reduce the pitch of interconnects, and to provide for a larger gap, or standoff, between individual chips for underfill flow over conventional solder controlled collapse chip connections (C4 connections). In copper pillar technology, a small amount of solder is still required to connect and join the copper pillars of one chip to a pad of another chip or substrate.

BRIEF SUMMARY

An embodiment of the invention may include a method of forming a semiconductor structure. The method may include forming a plurality of first conductive pillars on a first substrate. The method may include forming a first set of conductive nanowires on a first surface of the plurality of first conductive pillar. The method may include forming a plurality of second conductive pillars on a second substrate. The method may include forming a second set of conductive nanowires on a second surface of the plurality of second conductive pillar. The method may include forming an electrical connection between the first pillar and the second pillar by joining the first set of conductive nanowires with the second set of conductive nanowires.

An embodiment of the invention may include a method of forming a semiconductor structure. The method may include forming a plurality of first conductive pillars on a first substrate. The method may include forming a plurality of conductive nanowires on a first surface of the plurality of first conductive pillar. The method may include forming a plurality of second conductive pillars on a second substrate. The method may include forming a solder bump on a second surface of the plurality of second conductive pillar. The method may include forming an electrical connection between the first pillar and the second pillar by joining the plurality of conductive nanowires with the solder bump.

An embodiment of the invention may include a semiconductor structure. The semiconductor structure may include a first set of pillars located on a first substrate. The semiconductor structure may include a second set of pillars located on a second substrate. The semiconductor structure may include a joining layer connecting the first pillar to the second pillar. The semiconductor structure may include an underfill layer located between the first and second substrate.

BRIEF DESCRIPTION OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
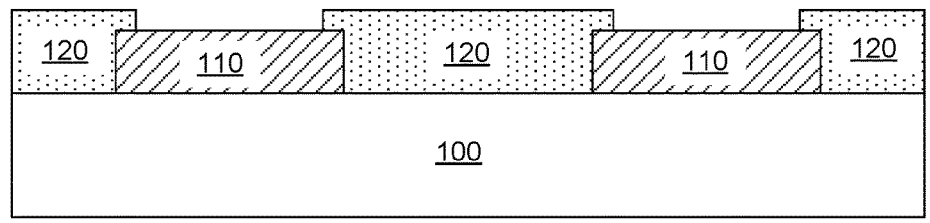
FIG. 1 represents a cross sectional view depicting a bond pad on a substrate, according to an example embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Semiconductor processing generally requires electrically connecting the semiconductor structures on a substrate to those of other substrates, as in 3-D chip fabrication, or to electrical connections on dies used for back end of the line connections. Solder interconnects have traditionally been used to form these connections, however the temperatures required to form the connections may create warping due to differing thermal expansion coefficients of the substrates to be joined. Additionally, as the electrical connections become increasingly small and close together, misalignment of the connections may cause the solder interconnections to block the path of underfill used to mechanically join and seal the component from the environment, thus leading to decreased chip performance.

In the following paragraphs, a process and device are described using conductive nanowires on a conductive pillar, such as copper nanowires on a copper pillar, as a mechanism to reduce the temperature necessary to form an electromechanical connection between conductive portions of two substrates. In one embodiment, conductive nanowires are used on both substrates, and the fusion of the nanowires forms the electromechanical connection between the substrates, and eliminates the need for traditional soldering techniques. In another embodiment, conductive nanowires on one substrate reduce the amount of solder on the other substrate necessary to form an electromechanical connection, thus reducing the amount of solder that may impede underfill material from entering the spaces between the two substrates.

Figure 2:
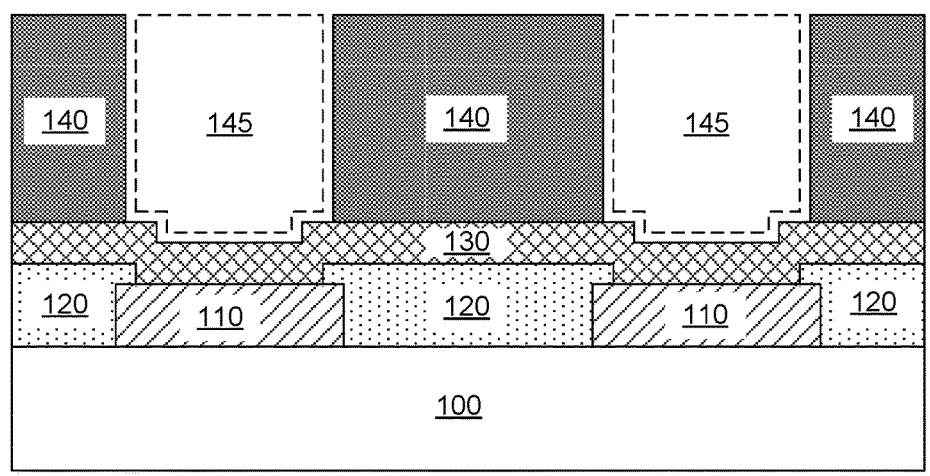
FIG. 2 represents a cross sectional view depicting forming a seed layer and patterning a photoresist, according to an example embodiment.
Figure 3:
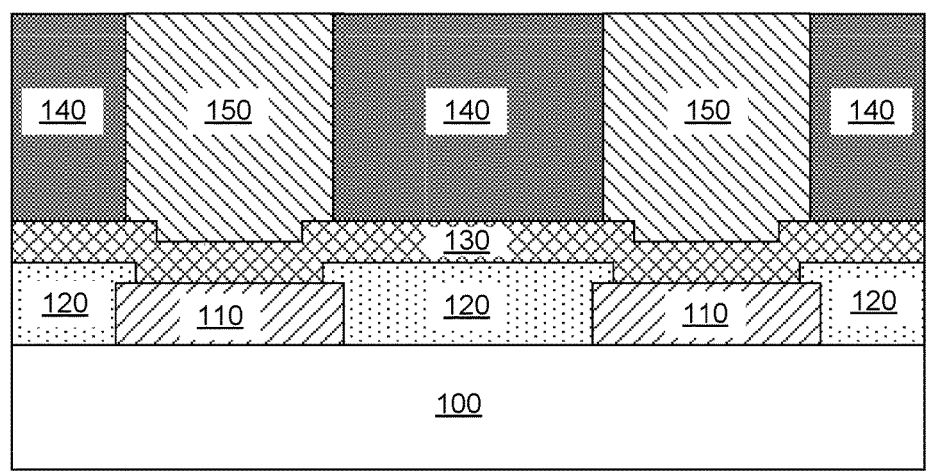
FIG. 3 represents a cross sectional view depicting forming a conductive pillar, according to an example embodiment.

Referring now to FIGS. 1-3, cross section views illustrating the preliminary process steps of forming of a pillar structure 100 are shown. In particular, FIG. 1 illustrates a bond pad 110 and passivation layer 120 located on a first substrate 100. The first substrate 100 may be either a dielectric layer formed above a device (not shown) or a semiconductor substrate. Further, the first substrate 100 may contain semiconductor structures electrically connected to bond pad 110. The bond pad 110 may be any electrically conductive material that leads to underlying structures on the device. For example, the bond pad 110 may include, for example, copper, aluminum, or tungsten. Passivation layer 120 may be any electrical insulating material, isolating each bond pad 110 from the others. Passivation layer 120 may include any suitable dielectric material, for example, silicon nitride ($Si_3N_4$), silicon carbide (SiC), silicon carbon nitride (SiCN), hydrogenated silicon carbide (SiCH).

Referring to FIG. 2, a seed layer 130 and a photoresist material 140 may be formed above the bond pad 110 and passivation layer 120. The seed layer 130 may be deposited on the bond pad 110 and passivation layer 120 using any conventional deposition technique known in the art, such as, for example, atomic layer deposition (ALD), chemical vapor deposition (CVD), low pressure CVD (LPCVD), physical vapor deposition (PVD), molecular beam deposition (MBD), pulsed laser deposition (PLD), liquid source misted chemical deposition (LSMCD), sputtering, or spin-on deposition. The seed layer 130 may encourage the adhesion of a conductive pillar 150 to the bond pad 110. The seed layer 130 may be composed of a metal or metal alloy, such as, for example, titanium, titanium tungsten, or titanium tungsten chrome copper. While the current embodiment shows the use of a seed layer 130, additional embodiments may use materials or methods that do not require the seed layer 130.

A photoresist material 140 may be deposited on passivation layer 120 using any conventional deposition technique, such as those listed above. In an embodiment, the photoresist material 140 may be deposited, for example, using a dry film lamination technique or spin on liquid resist technique. The photoresist material 140 may then be subjected to a conventional lithographic techniques (i.e., light exposure and development) to solidify the photoresist material and form an opening 145.

Referring to FIG. 3, a conductive pillar 150 may be formed in the opening 145 and in contact with seed layer 130 by depositing a conductive material in the opening. In an embodiment, the conductive material may be copper or an alloy thereof. In another embodiment, a different metal/metal alloy may be used for the conductive pillar 150 such as, for example, cobalt or nickel. Although other metals are contemplated by the invention, copper or copper alloys will be referred to hereinafter as the material used with the invention, but this should not be considered a limiting feature. The conductive pillar 150 may have a height ranging from approximately 20 µm to approximately 60 µm.

Figure 4:
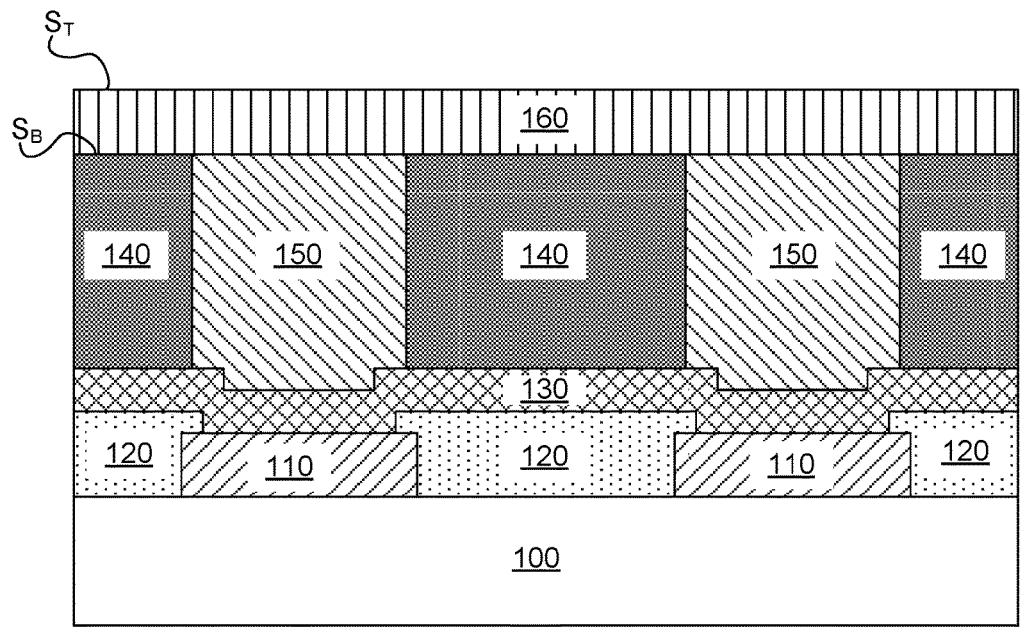
FIG. 4 represents a cross sectional view depicting forming a porous layer above the conductive pillar, according to an example embodiment.

Referring to FIG. 4, a porous layer 160 may be formed above photoresist material 140 and the conductive pillar 150. The porous layer 160 contains one or more pores that extend from the bottom surface of the porous layer $S_B$ to the top surface of the porous layer $S_T$. In a preferred embodiment, the pores may range in diameter from 25 to 500 nm, and may be in a concentration of 4 to 400 pores/$(\mu m)^2$. The porous layer 160 may have a thickness of 50 to 1000 nm. In one embodiment, the porous layer 160 may be formed using a polymerization process that results in a porous material, such as, for example, forming a polycarbonate membrane. In another example, an anodized alumina oxide membrane may be formed.

Figure 5:
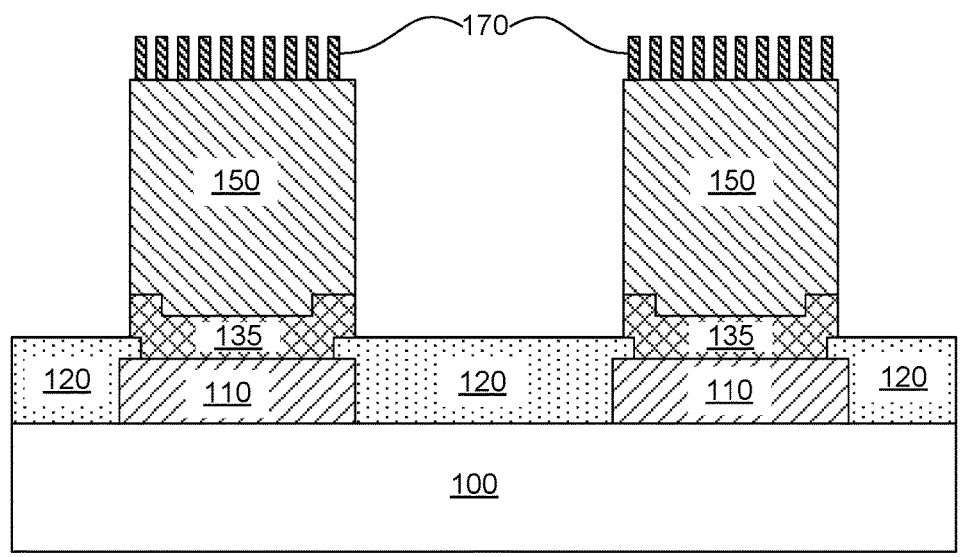
FIG. 5 represents a cross sectional view depicting forming conductive nanowires on the conductive pillar, and removing the porous layer and photoresist, according to an example embodiment.

Referring to FIG. 5, first conductive nanowires 170 are formed on the top surface of the conductive pillar 150, and porous layer 160 and photoresist material 140 are removed. During formation of the first conductive nanowires 170, the material may take the shape of the pores of porous layer 160, and may only join with the top surface of conductive pillar 150. The first conductive nanowires 170 may contain, for example, copper, nickel, aluminum, or tungsten. In an example embodiment, the conductive nanowires 170 and conductive pillar 150 may be formed using the same material. The first conductive nanowires 170 may be formed using a filing technique such as electroplating, electrophoresis, electroless plating, chemical vapor deposition, physical vapor deposition or a combination of methods.

Still referring to FIG. 5, the porous layer 160, the photoresist material 140 and seed layer 130 beneath the photoresist material 140 may be removed to leave the final pillar structure, first conductive nanowires 170 and pillar seed layer 135. In an embodiment, the photoresist material 140 may be stripped selective to the conductive pillar 150 and passivation layer 120 using laser ablation. Laser ablation is a technique in which a laser beam irradiates the surface of a material to evaporate or sublimate the material away, and thus leaving the underlying structures. By selecting the right wavelengths of light, and pulses of the laser light, laser ablation may only heat and remove the desired material without unnecessarily heating surrounding materials. Laser ablation selectively removes the unnecessary materials, without damaging (or with minimal damage) to the first conductive nanowires 170, as compared to traditional wet or dry etching techniques that would dissolve the conductive nanowires 170 due to the narrow diameters involved.

Figure 6:
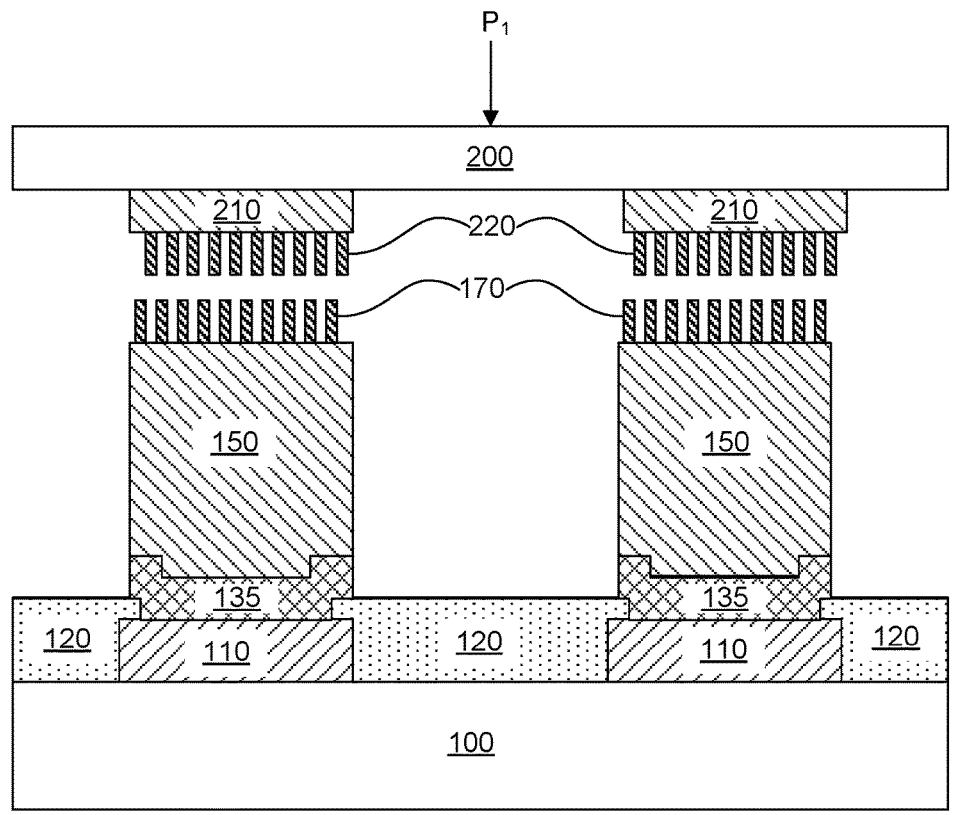
FIG. 6 represents a cross sectional view depicting joining the structure of FIG. 5 to a second substrate, according to an example embodiment.
Figure 7:
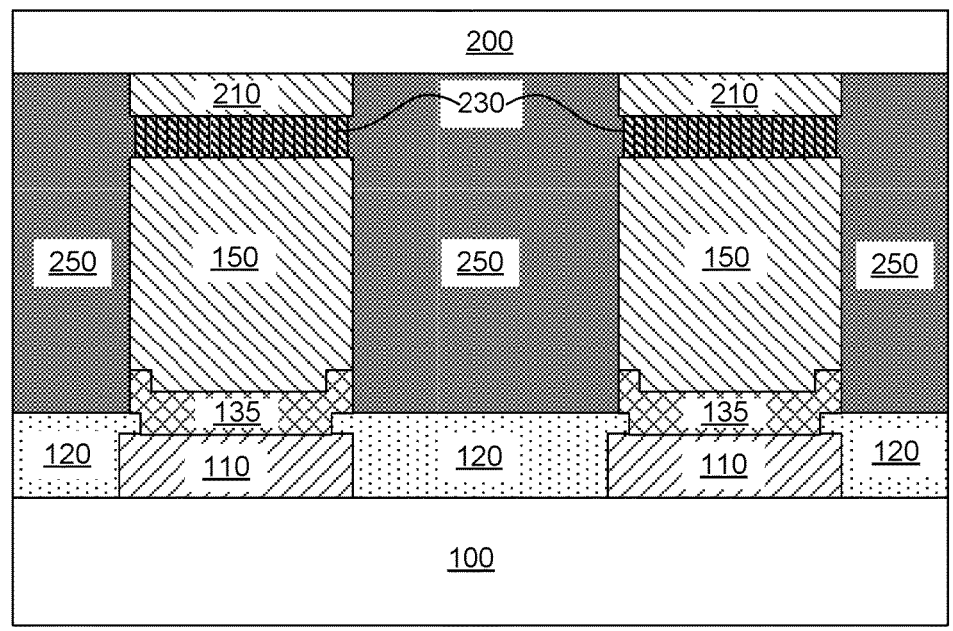
FIG. 7 represents a cross sectional view depicting forming an underfill between the two substrates, according to an example embodiment.

FIGS. 6 and 7 shows a first embodiment of joining the structure pictured in FIG. 5 to another substrate. Referring to FIGS. 6 and 7, the conductive pillars 150 and first conductive nanowires 170 may be joined to a first conductive structure 210, located on a second substrate 200, using a second conductive nanowire 220. The processes for making the first conductive structure 210 and the second conductive nanowire 220 may be the same as those for the conductive pillars 150 and first conductive nanowires, respectively. Additionally, the second substrate 200 may contain additional semiconductor structures, similar to those located on the first substrate 100. Further, the space between the first substrate 100 and second substrate 200 may be filled with an underfill layer 250.

Still referring to FIG. 6, the first substrate 100 may be joined to the second substrate 200 using thermal compression to create an electrical connection between conductive pillar 150 and conductive structure 210. A thermal compression tool, such as a flip-chip bonder, may be used to apply the temperature and the pressure, and form the electrical connection by fusing the first conductive nanowires 170 with the second conductive nanowires 220, forming a nanowire fused connection 230 (FIG. 7) between the two structures. This may allow for semiconductor structures on the first substrate 100 to be electrically connected to features or structures located on the second substrate 200. During bonding, temperatures below the reflow temperature of material of the first conductive nanowires 170 and the second conductive nanowires 220 may fuse the two structures together as the increased surface area of the nanowires enables a phase transition, or reorganization of the structure of the adjoining materials, at a temperature much lower than the bulk melting point of the material, thus creating an electromechanical connection between the two structures. The temperatures may range from about 150° C. to about 230° C., and more preferably from about 150° C. to about 200° C., and the temperatures used in the thermal compression tool may range from about 200° C. to about 400° C. The applied temperatures of the thermal compression tool may depend on the interconnect material and chip size. A pressure ranging from about $6.0\times10^4$ Pa to about $6.0\times10^5$ Pa may be applied during the assembly using the thermal compression tool, although this pressure may be adjusted based on the contact area and materials to be interconnected. In one embodiment, a force ranging from about 5 N to about 50 N may be applied. The force too may be adjusted based on the contact area and materials to be interconnected. In some cases, there may be between 1,000 and 170,000 connections between components.

Referring to FIG. 7, the space created between the first substrate 100 and the second substrate 200 is then underfilled, with underfill layer 250, in order to strengthen the interconnections. A curable non-conductive polymeric underfill material is dispensed onto the substrate adjacent to the chip and is drawn into the gap by capillary action, forming underfill layer 250. The underfill material provides environmental protection, and mechanically locks together the first substrate 100 and the second substrate 200 so that differences in thermal expansion of the two materials do not break the nanowire fused connection 230. The underfill material may comprise one or more polymerizable monomers, polyurethane prepolymers, constituents of block copolymers, constituents of radial copolymers, initiators, catalysts, cross-linking agents, stabilizers, and the like. Such materials polymeric materials contain molecules that are chained or cross-linked to form a strong bonding material as they are cured and hardened.

A resultant semiconductor structure is created, where an electrical connection is formed between the first substrate 100 and second substrate 200 through the fused connection 230. The fused connection 230 represents an electrically conductive region formed by the first conductive nanowires 170 and the second conductive nanowires 220, thus allowing structures or devices on the first substrate 100 to be electrically connected, and thus send signals, to structures or devices located on the second substrate 200.

Figure 8:
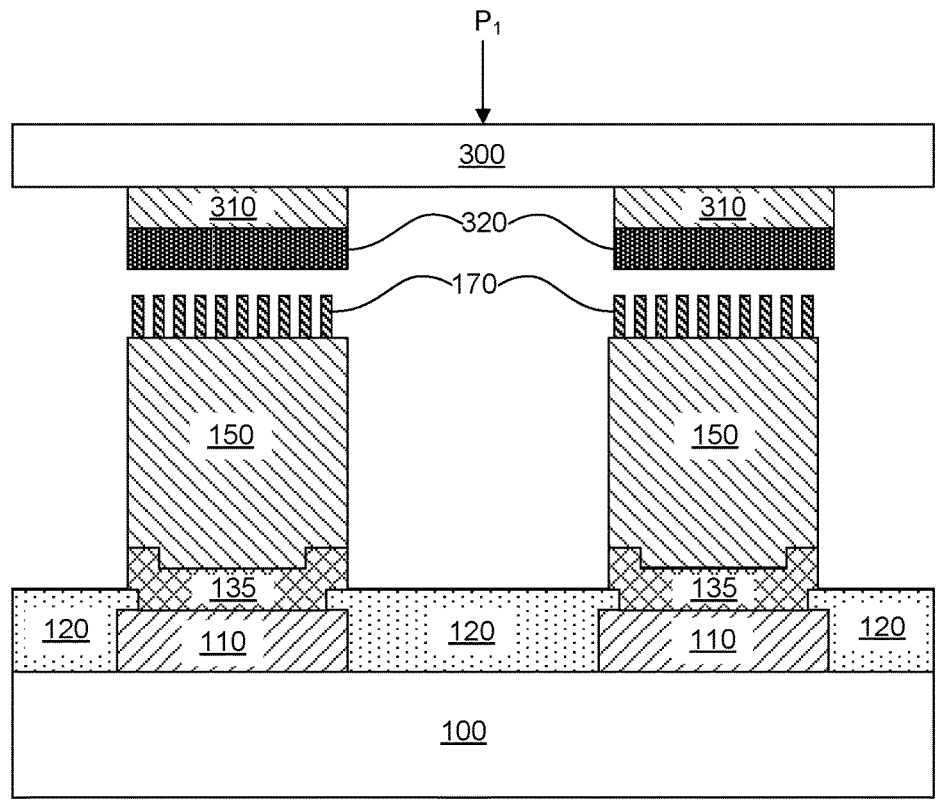
FIG. 8 represents a cross sectional view depicting joining the structure of FIG. 5 to a third substrate, according to an example embodiment.
Figure 9:
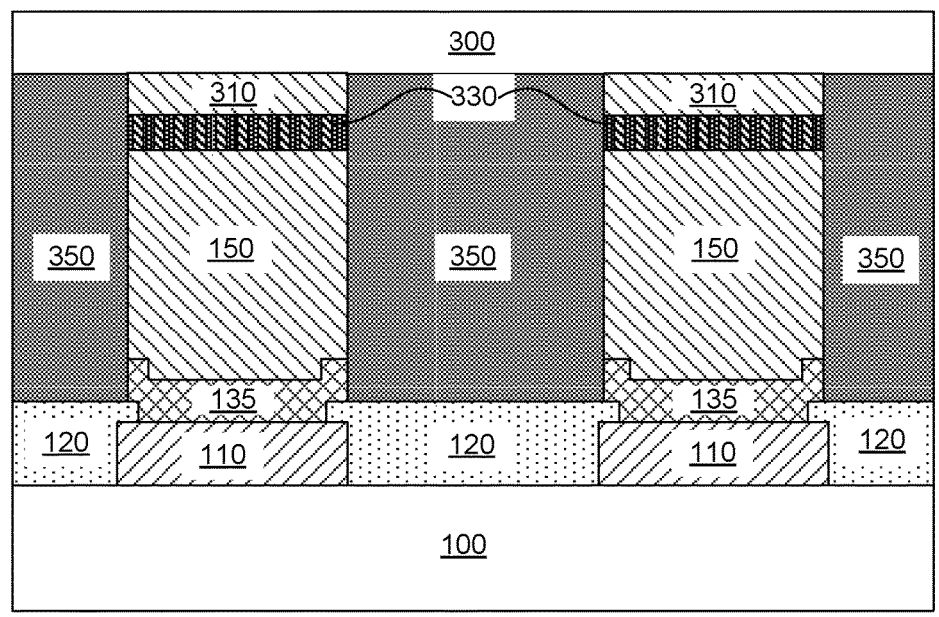
FIG. 9 represents a cross sectional view depicting forming an underfill between the two substrates, according to an example embodiment.

FIGS. 8 and 9 shows a second embodiment of joining the structure pictured in FIG. 5 to another substrate. Referring to FIGS. 8 and 9, the conductive pillars 150 and first conductive nanowires 170 may be joined to a second conductive structure 310, located on a third substrate 300, using a solder bump 320. The processes for making the second conductive structure 310 may be the same as those for the conductive pillars 150. Additionally, the third substrate 300 may contain additional semiconductor structures, similar to those located on the first substrate 100. Further, the space between the first substrate 100 and third substrate 300 may be filled with an underfill layer 350.

Still referring to FIG. 8, the first substrate 100 may be joined to the third substrate 300 using thermal compression to create an electrical connection between conductive pillar 150 and second conductive structure 310. A thermal compression tool, such as a flip-chip bonder, may be used to apply the temperature and the pressure, and form the electrical connection using, for example, the first conductive nanowire 170 and the solder bump 320. A temperature just below the reflow temperature of the solder may be used to form the requisite electromechanical connection, as the increased surface area of the first conductive nanowire 170 may reduce the temperature necessary to achieve a structural reorganization of the solder and the copper to create an electromechanical connection, referred to as solder fused connection 330, between the first conductive nanowire 170 and the solder bump 320. The reflow temperatures of common lead-free solder bumps may range from about 210° C. to about 250° C., and the temperatures used in the thermal compression tool may range from about 230° C. to about 400° C. The applied temperatures of the thermal compression tool may depend on the interconnect material and chip size. A pressure ranging from about $6.0\times10^4$ Pa to about $6.0\times10^5$ Pa may be applied during the 3D assembly using the thermal compression tool, although this pressure may be adjusted based on the contact area and materials to be interconnected. In one embodiment, a force ranging from about 5 N to about 50 N may be applied. The force too may be adjusted based on the contact area and materials to be interconnected. In some cases, there may be between 1,000 and 170,000 connections between components.

Referring to FIG. 9, the space created between the first substrate 100 and the third substrate 300 is then underfilled, with underfill layer 350, in order to strengthen the interconnections. A curable non-conductive polymeric underfill material is dispensed onto the substrate adjacent to the chip and is drawn into the gap by capillary action, forming underfill layer 350. The underfill material provides environmental protection, and mechanically locks together the first substrate 100 and the second substrate 200 so that differences in thermal expansion of the two materials do not break the solder fused connection 330. The underfill material may comprise one or more polymerizable monomers, polyurethane prepolymers, constituents of block copolymers, constituents of radial copolymers, initiators, catalysts, cross-linking agents, stabilizers, and the like. Such materials polymeric materials contain molecules that are chained or cross-linked to form a strong bonding material as they are cured and hardened.

A resultant semiconductor structure is created, where an electrical connection is formed between the first substrate 100 and third substrate 300 through the solder fused connection 330. The solder fused connection 330 represents an electrically conductive region formed by the first conductive nanowires 170 and the solder bump 320, thus allowing structures or devices on the first substrate 100 to be electrically connected, and thus send signals, to structures or devices located on the second substrate 200.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a semiconductor structure comprising:
   forming a plurality of first conductive pillars on a first substrate, wherein forming the plurality of first conductive pillars comprises:
      forming a masking layer on a masked region of a first substrate, and wherein an unmasked region of the first substrate comprises a plurality of electrical connections; and
      forming a conductive material in the unmasked region, forming the plurality of first conductive pillars on the first substrate;
   forming a first set of conductive nanowires on a first surface of the plurality of first conductive pillars, wherein forming a first set of conductive nanowires comprises:
      forming a porous layer on a surface of the plurality of first conductive pillars, wherein the porous layer comprises a plurality of pores extending from an exposed surface of the porous layer to the surface of the plurality of the first conductive pillars; and
      forming a conductive material in the plurality of pores;
   following the formation of the first set of conductive nanowires, removing the masking layer and porous layer using laser ablation, wherein laser ablation selectively removes the masking layer and porous layer with respect to the first set of conductive nanowires;
   forming a plurality of second conductive pillars on a second substrate;
   forming a solder bump on a second surface of the plurality of second conductive pillars; and
   forming an electrical connection between the first pillar and the second pillar by joining the first set of conductive nanowires with the solder bump.

2. The method of claim 1, wherein the porous layer has a concentration of 4 pores/$(\mu m)^2$ to 400 pores/$(\mu m)^2$.

3. The method of claim 1, wherein forming an electrical connection between the first pillar and the second pillar comprises:
   aligning the first set of conductive nanowires with the second set of conductive nanowires; and
   performing thermal compression to join the first set of conductive nanowires to the second set of conductive nanowires.

4. The method of claim 3, wherein thermal compression is performed at a temperature of about 150° C. to about 230° C.

5. The method of claim 1, further comprising depositing an underfill layer between the first substrate and the second substrate.

6. The method of claim 1, further comprising forming a seed layer above the first substrate, wherein the seed layer comprises a material selected from the group consisting of: titanium, titanium tungsten, and titanium tungsten chrome copper; and wherein the forming a conductive material in the unmasked region, comprises forming the plurality of first conductive pillars on seed layer located on the first substrate.

7. The method of claim 6, wherein removing the masking layer using laser ablation further comprises removing the seed layer using laser ablation.

8. A method of forming a semiconductor structure comprising:
   forming a plurality of first conductive pillars on a first substrate, wherein forming the plurality of first conductive pillars comprises:
      forming a masking layer on a masked region of a first substrate, and wherein an unmasked region of the first substrate comprises a plurality of electrical connections; and
      forming a conductive material in the unmasked region, forming the plurality of first conductive pillars on the first substrate;
   forming a first set of conductive nanowires on a first surface of the plurality of first conductive pillars, wherein forming a first set of conductive nanowires comprises:
      forming a porous layer on a surface of the plurality of first conductive pillars, wherein the porous layer comprises a plurality of pores extending from an exposed surface of the porous layer to the surface of the plurality of the first conductive pillars; and
      forming a conductive material in the plurality of pores; and
   following the formation of the first set of conductive nanowires, removing the masking layer and porous layer using laser ablation, wherein laser ablation selectively removes the masking layer and porous layer with respect to the first set of conductive nanowires.

9. The method of claim 8, wherein the porous layer has a concentration of 4 pores/$(\mu m)^2$ to 400 pores/$(\mu m)^2$.

10. The method of claim 8, further comprising forming a seed layer above the first substrate, wherein the seed layer comprises a material selected from the group consisting of: titanium, titanium tungsten, and titanium tungsten chrome copper; and wherein the forming a conductive material in the unmasked region, comprises forming the plurality of first conductive pillars on seed layer located on the first substrate.

11. The method of claim 10, wherein removing the masking layer using laser ablation further comprises removing the seed layer using laser ablation.

* * * * *